United States Patent
Aramaki et al.

(10) Patent No.: US 8,178,397 B2
(45) Date of Patent: May 15, 2012

(54) FIELD EFFECT TRANSISTOR

(75) Inventors: Shinji Aramaki, Yokohama (JP);
Ryuichi Yoshiyama, Yokohama (JP);
Akira Ohno, Yokohama (JP);
Yoshimasa Sakai, Yokohama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 258 days.

(21) Appl. No.: 11/719,096

(22) PCT Filed: Nov. 10, 2005

(86) PCT No.: PCT/JP2005/020639
§ 371 (c)(1),
(2), (4) Date: May 11, 2007

(87) PCT Pub. No.: WO2006/051874
PCT Pub. Date: May 18, 2006

(65) Prior Publication Data
US 2009/0072224 A1    Mar. 19, 2009

(30) Foreign Application Priority Data
Nov. 11, 2004 (JP) .................... 2004-327627
Mar. 25, 2005 (JP) .................... 2005-089935

(51) Int. Cl.
*H01L 51/40* (2006.01)
*H01L 21/145* (2006.01)

(52) U.S. Cl. ..... 438/149; 436/17; 436/99; 257/E21.529; 257/E21.531

(58) Field of Classification Search .................... 257/40, 257/E21.521, E21.529, E21.531; 438/14, 438/17, 99, 149
See application file for complete search history.

(56) References Cited

U.S. PATENT DOCUMENTS

| | | | |
|---|---|---|---|
| 6,875,996 B2 * | 4/2005 | Nakamura | 257/40 |
| 7,094,625 B2 * | 8/2006 | Miura et al. | 438/99 |
| 7,164,190 B2 * | 1/2007 | Kobashi et al. | 257/642 |
| 7,193,237 B2 | 3/2007 | Aramaki et al. | |
| 2002/0080102 A1 * | 6/2002 | Asao et al. | 345/87 |
| 2003/0107565 A1 * | 6/2003 | Libsch et al. | 345/211 |
| 2003/0226996 A1 | 12/2003 | Aramaki et al. | |
| 2004/0065929 A1 | 4/2004 | Koo et al. | |
| 2006/0180809 A1 * | 8/2006 | Park et al. | 257/40 |
| 2007/0145361 A1 | 6/2007 | Aramaki et al. | |

FOREIGN PATENT DOCUMENTS
EP    0 921 579 A2    6/1999
(Continued)

OTHER PUBLICATIONS

JP2004-029701 (JP Pub No. 2004-256532 machine translation).*
(Continued)

*Primary Examiner* — Jerome Jackson, Jr.
*Assistant Examiner* — Yu Chen
(74) *Attorney, Agent, or Firm* — Oblon, Spivak, McClelland, Maier & Neustadt, L.L.P.

(57) ABSTRACT

A field effect transistor including a gate insulation portion, an organic semiconductor portion, a source electrode and a drain electrode, wherein when a voltage is applied to the gate at 70° C. for 5.0±0.1 hours so that the field strength in the gate insulation portion would be 100±5 MV/m, the change in the threshold voltage is within 5 V. The organic semiconductor portion has a high driving stability, of which the change in characteristics by driving is thereby small.

5 Claims, 2 Drawing Sheets

FOREIGN PATENT DOCUMENTS

| | | |
|---|---|---|
| JP | 04-048735 | 2/1992 |
| JP | 6-291312 | 10/1994 |
| JP | 11 183935 | 7/1999 |
| JP | 2003-502874 | 1/2003 |
| JP | 2003-304014 | 10/2003 |
| JP | 2004 118132 | 4/2004 |
| JP | 2004-128467 | 4/2004 |
| JP | 2004 256532 | 9/2004 |
| JP | 2004-273677 | 9/2004 |
| JP | 2004-349319 | 12/2004 |
| JP | 2005-93990 | 4/2005 |
| JP | 2005-268450 | 9/2005 |
| JP | 2005-289054 | 10/2005 |
| JP | 2006-165533 | 6/2006 |
| WO | WO 03/016599 | 2/2003 |
| WO | WO 2004/012271 A1 | 2/2004 |
| WO | WO 2004012271 A1 * | 2/2004 |
| WO | WO 2004087836 A1 * | 10/2004 |

OTHER PUBLICATIONS

Gomes et al.; "Bias-induced threshold voltage shifts in thin-film organic transistors", Applied Physics Letters, vol. 84, No. 16, 2004, 3184-3186.*

Knipp, D. et al.,"Pentacene Thin Film Transistors on Inorganic Dielectrics: Morphology, Structural Properties, and Electronic Transport", Journal of Applied Physics, vol. 93, No. 1, pp. 347-355, 2003.

Street, R. A. et al.,"Bipolaron Mechanism for Bias-stress Effects in Polymer Transistors", Physical Review B, vol. 68, No. 085316-1, 2003.

Zilker, S. J. et al.,"Bias Stress in Organic Thin-film Transistors and Logic Gates", Applied Physics Letters, vol. 79, No. 8, pp. 1124-1126, 2001.

Afzali, A. et al.,"High-Performance, Solution-Processed Organic Thin Film Transistors from a Novel Pentacene Precursor", J. Am. Chem. Soc., vol. 124, pp. 8812-8813, 2002.

Shinji Aramaki et al. "Solution-processible organic semiconductor for transistor applications: Tetrabenzoporphyrin"; Applied Physics Letters; vol. 84 No. 12; Mar. 22, 2004; pp. 2085-2087.

C. D. Dimitrakopoulos, et al. "Organic thin-film transistors: A review of recent advances", IBM J. Res. & Dev.; vol. 45 No. 1; Jan. 2001; pp. 11-20.

H. E. Katz, et al. "The Physical Chemistry of Organic Field-Effect Transistors"; J. Phys. Chem. B; vol. 104; No. 4; 2000; XP-000900636; pp. 671-678.

C. D. Dimitrakopoulos, et al. "Solution-processed organic semiconductor films"; IBM J. Res. & Dev.; vol. 45 No. 1; Jan. 2001; pp. 21-27.

Office Action issued Sep. 22, 2010, in Europe Patent Application No. 05 806 285.2-1235.

European Office Action issued on Mar. 2, 2011 in corresponding European Application No. 05 806 285.2.

Office Action (with English translation) issued on Dec. 27, 2011, in counterpart Korean Appln. No. 2007-7006295 (8 pages).

Office Action (with English translation) issued on Jan. 4, 2012, in related Japanese Appln. No. 2005-326084 (9 pages).

Office Action (with English translation) issued on Jan. 4, 2012, in related Japanese Appln. No. 2005-353600 (9 pages).

* cited by examiner

FIELD EFFECT TRANSISTOR

TECHNICAL FIELD

The present invention relates to a field effect transistor. More particularly, it relates to a field effect transistor having an organic semiconductor portion formed by employing an organic semiconductor.

BACKGROUND ART

In a field effect transistor comprising a support substrate, and a gate electrode and a semiconductor portion separated by a gate insulation portion, a source electrode and a drain electrode provided so as to contact the semiconductor portion formed on the support substrate, an organic material is used for the semiconductor portion. The organic material attracts attention because the semiconductor portion can be formed by application of its solution, and weight reduction can be achieved and impact strength can be imparted by use of e.g. a polymer, in addition to advantage in view of cost over a conventional formation process by e.g. vacuum process employing an inorganic material such as a silicon.

However, a device employing an organic semiconductor has been known to be generally poor in driving stability as compared with an inorganic semiconductor device. As one item representing the driving stability, a shift in the threshold voltage may be mentioned. That is, the threshold voltage changes by a stress by application of a gate voltage. In a case of an inorganic semiconductor material, a shift in the threshold voltage within 3 V is considered to be tolerable in view of practicability within the life of a display device which is a typical application of the field effect transistor. However, in a case of a field effect transistor employing an organic material such as pentacene or a polyfluorene polymer for the semiconductor, the shift in the threshold voltage is significant, such being practically problematic (Non-Patent Documents 1 to 3).

Further, Non-Patent Document 4 proposes a process of forming an organic semiconductor layer by applying a pentacene precursor solution, followed by conversion into pentacene. However, according to studies by the present inventors, in a field effect transistor to be produced by the proposed process, the mobility of the semiconductor layer is at a level of 089 cm$^2$/(V·s).

Non-Patent Document 1: Journal of Applied Physics, 2003, Vol. 93, p. 347-354

Non-Patent Document 2 Physical Review 3, 2003, Vol. 68, No. 085316

Non-Patent Document 3: Applied Physics Letters, Vol. 79, No. 8, p. 1124-1125

Non-Patent Document 4: Journal of American Chemical Society, 2002, Vol. 124, p. 8812-8813

DISCLOSURE OF THE INVENTION

Problems that the Invention is to Solve

In a conventional organic semiconductor, the change in the threshold voltage due to a voltage stress is significant, and such an organic semiconductor is by no means satisfactory for use as a device for a pixel circuit to display motional pictures such as a liquid crystal display. Particularly in a case of a current drive device represented by organic EL, a transistor (driver transistor) which supplies the current to the organic EL device may always be in an on-state where a voltage is applied to the gate during display, and accordingly stress conditions on the gate voltage are severe. Further, in a case where field effect transistors are combined to prepare a circuit such as an inverter or an AND circuit, which is utilized for a peripheral circuit such as a shift register of a display, a decrease in drive current is caused due to changes in characteristics attributable to the shift in the threshold voltage, and a decrease in the speed of response, etc. tends to be problematic.

Accordingly an organic field effect transistor with a small shift in the threshold voltage by long-term application of a gate voltage (stress) has been desired. Accordingly, it is an object of the present invention to provide a field effect transistor which has an organic semiconductor portion, the organic semiconductor portion having high driving stability, and of which changes in characteristics are thereby small.

Further, according to studies by the present inventors, it was found that a conventional semiconductor has insufficient output current characteristics and is by no means satisfactory for use as a device for a drive circuit to display motion pictures such as a liquid crystal display. Accordingly, it is an object of the present invention to provide a field effect transistor which has an organic semiconductor portion formed by employing an organic semiconductor solution, the organic semiconductor portion having a high mobility, and which thereby has high current driving capability.

Means of Solving Problems

The present inventors have conducted extensive studies to overcome the above issues and as a result, found that when the shift in the threshold voltage of an organic field effect transistor is at most a specific value, such a field effect transistor has driving stability and is practically useful. The present invention has been accomplished on the basis of this discovery.

Namely, the present invention resides in a field effect transistor comprising a gate insulation portion, an organic semiconductor portion, a source electrode and a drain electrode, wherein when a voltage is applied to the gate at 70° C. for 5.0±0.1 hours so that the field strength in the gate insulation portion would be 100±5 MV/m, the change in the threshold voltage is within 5 V.

The present invention further resides in a field effect transistor comprising a gate insulation portion, an organic semiconductor portion, a source electrode and a drain electrode, wherein the organic semiconductor portion is formed by employing an organic semiconductor solution, and the mobility of the organic semiconductor portion is at least 10 cm$^2$/(V·s).

Effects of the Invention

According to the present invention, a field effect transistor which has an organic semiconductor portion formed by employing an organic semiconductor solution, the organic semiconductor portion having increased driving stability and which thereby has long lifer and a display device and an electronic circuit employing it, can be provided.

Further, according to the present invention, a field effect transistor which has an organic semiconductor portion formed by employing an organic semiconductor solution, the organic semiconductor portion having an increased mobility, and which thereby has high current driving capability, can be provided.

EXPLANATION OF SYMBOLS

Figure 1A:
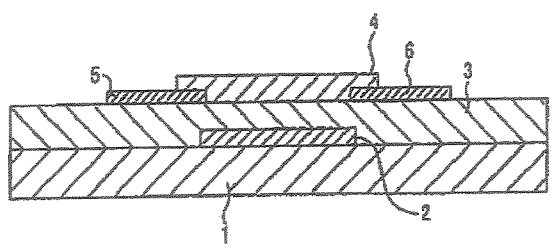
FIG. 1 is vertical sectional views illustrating an example of a horizontal field effect transistor (FET) among field effect transistors of the present invention.

1: support substrate, 2: gate electrode, 3: gate insulation portion, 4: organic semiconductor portion, 5: source electrode 6: drain electrode.

BEST MODE FOR CARRYING OUT THE INVENTION

Now, the present invention will be explained in detail below. However, the present invention is by no means restricted to the following embodiments, and various changes are possible within a range of the scope of the invention.

The field effect transistor of the present invention comprises at least a gate insulation portion, an organic semiconductor portion, and a source electrode and a drain electrode. Preferably, it further has a support substrate and a gate electrode. More preferably, it comprises a support substrate, and a gate electrode and an organic semiconductor portion separated by a gate insulation portion, and a source electrode and a drain electrode provided so as to contact the organic semiconductor portion, formed on the support substrate. The mechanism of a field effect transistor is such that when a voltage is applied to the gate electrode, a current flow path (channel) is formed at the interface between the gate insulation portion and the organic semiconductor portion between the source electrode and the drain electrode, and by such a structure, the current which flows between the source electrode and the drain electrode is controlled by an input voltage applied to the gate electrode.

(Change in Threshold Voltage of Field Effect Transistor)

The field effect transistor of the present invention is character-zed in that when a voltage is applied to the gate at 70° C. for 5.0±0.1 hours so that the field strength in the gate insulation portion would be 100±5 MV/m, the change in the threshold voltage is within 5 V.

Application of such a voltage that the field strength in the gate insulation portion would be 100±5 MV/m to the gate means that the field strength (unit: V/m) would be (100±5)× $10^6$, as obtained by dividing the voltage to be applied between the source electrode and the drain electrode by the thickness of the gate insulating film. The application time is 5.0±0.1 hours, and it is acceptable to examine FET characteristics within one second after application for at least 50 seconds so as to monitor the change in the threshold voltage during application.

The threshold voltage can be obtained by the current-voltage characteristics of the field effect transistor. For example, the drain current in a saturation region of the field effect transistor is obtained from the following formula (1)

$$I_d = [WC_i/(2L)]\mu(V_g-V_t)^2 \quad (1)$$

wherein $I_d$ is the drain current, W is the width of the electrode, L is the length of the electrode, $C_i$ is the capacitance, μ is the mobility, $V_g$ is the gate voltage and $V_t$ is the threshold voltage.

From the above formula, plotting the square root of the drain current in the saturation region and the gate voltage, the mobility is determined from the slope of a linear portion, and the threshold voltage is determined from the voltage of an intercept where the drain current=00 extrapolating the linear portion. Further, the drain current at a certain insulating film, is determined by the mobility μ and the threshold voltage $V_t$ unless the shape (W, L) of the electrode and the capacitance ($C_i$) of the insulating film are changed. When the mobility μ is confirmed not to change, the change in the drain current is attributable to the change in the threshold voltage.

The change in the drain current due to application of a voltage is preferably small, and preferably the change in the threshold voltage is within 5 V, preferably at most 4 V, furthermore preferably at most 3 V.

The reason of the shift in the threshold voltage is not clearly understood, but e.g. formation of trap levels in the semiconductor is considered to be responsible, and generally the shift tends to be significant when the temperature is increased. For example, in a transistor employing an amorphous silicon for the semiconductor portion, the shift in the threshold voltage is represented by the following empirical formula (TFT/LCD Liquid-Crystal Displays Addressed by Thin-Film Transistors, 1996, p. 67, T. Tsukada, Gordon and Breach Science Publishers):

$$\Delta V_t = A|V_g|^\beta t^\gamma \exp\left[-\frac{E_a}{kT}\right] \quad (2)$$

Here, β is from 1 to 2, γ is from 3.3 to 0.4 and $E_a$ is from 0.2 to 0.3 eV. In a case of an organic semiconductor, assuming the temperature dependency and the gate voltage dependency close thereto, it is possible to employ β=1.5 and $E_a$=0.25 eV.

In general, a shift in the threshold voltage at room temperature within 3 V is considered to be practically tolerable in view of the life of the display device. If the shift in the threshold voltage exceeds the tolerance of an outer drive circuit by changes of transistor characteristics, no desired operation of the display will be achieved. Accordingly the shift in the threshold voltage is preferably small, and particularly a shift within 3 V is practically very advantageous since the gate voltage can be small, and accordingly the electric power consumption can be reduced and accordingly the process/design for IC for a drive circuit can be designed for low voltage operation whereby a remarkable effect of cost reduction will be achieved.

Usually, when a display is driven a voltage is applied so as to achieve an electric field at a level of 50 MV/m. Namely, if the field strength of 100 MV/m is applied to the gate insulate at 70° C., the threshold voltage shift is accelerated by a factor of 10, compared with at room temperature.

Further since a voltage is applied only to one of lines in the vertical direction of the display (1/768 in a case of XGA with 768 lines), the time during which the gate voltage is practically applied is about 26 hours assuming the life of the display is 20,000 hours.

Accordingly, when the threshold voltage shift is within (3/26)×10×5=5.7 V, even when a voltage is applied to the gate at 70° C. for 5 hours so that the field strength in the gate insulate is 100 MV/m, the device fulfills the requirement for the operational lifetime at room temperature.

In a liquid crystal display since alternating current drive is employed, a reverse polarity gate voltage is also applied, and in such a case, a shift in the threshold voltage in an opposite direction will occur. Accordingly, the total change in the threshold voltage is expected to be smaller than the shift by application of one polarity voltage, by counterbalance. However, there is also a driving method wherein no reverse polarity is applied, such as an organic EL or an electrophoretic display, and thus a preferred organic transistor has a small shift in the threshold voltage by application of one polarity voltage as disclosed in the present invention.

For a pixel circuit of a current-driven display such as organic EL, usually a transistor which turns on when a pixel called a switching transistor is selected and a driving transistor which controls the current to pixels (organic EL) are employed. A gate voltage may always be applied to the drive transistor to supply current to the organic EL device portion, and the change in the threshold voltage is more problematic than in the switching transistor. Accordingly, a circuit which does not depend on the threshold voltage is devised, but even such a circuit can not operate if the threshold voltage changes too significantly. When the change in the threshold voltage is within 3 V, such a field effect transistor can be utilized as a driving transistor of organic EL without any problem.

Deep traps present in the semiconductor portion are considered as a cause which increases the change in the threshold voltage. Charges trapped in the deep traps can not move, and cause the change in the threshold voltage. An organic semiconductor film having a relatively high mobility of at least 0.01 cm.sup.2/V.sub.s usually a polycrystalline film or a polymer with ordered structure if it is not single crystal. Single crystals of an organic substance are very difficult to prepare and handle and are thereby not practical, and accordingly they are excluded. The cause of deep traps may, for example, be impurities, ones present in the vicinity of grain boundaries between particles or one due to structural defects in particles. Accordingly, the following methods may be mentioned to reduce the change in the threshold voltage resulting from a voltage stress of the organic semiconductor formed by coating.

(1) An organic semiconductor material having a high purity is used.

In order to reduce deep traps derived from impurities, an organic material having high purity is used. A purity of at least 95 wt % is preferred, at least 97 wt % is more preferred.

(2) The sizes of crystal grains are increased to reduce the junction points among particles.

For example, the junction points themselves between particles are reduced by selecting an organic semiconductor material the crystal grains of which tend to be large, or by selecting such film formation conditions under which the crystal grains tend to be large.

(3) Traps present between crystal particles are controlled.

For example, it is considered to make the traps between particles shallow or to reduce them by applying a suitable overcoat treatment. When an overcoat treatment is applied an overcoating agent reaches a channel formation region of the semiconductor film in the vicinity of the gate insulating film, which is important to electrical characteristics of the organic transistor, through spaces between particles, directly affects the trap portion present between the particles, and makes the traps be shallow or removes them. It is required to select an appropriate material to be combined depending upon the semiconductor material.

(4) In a device having a bottom gate structure, an organic polymer is used for an insulating film and an organic semiconductor is formed thereon.

It is considered that in production of a film of an organic semiconductor on an organic polymer insulating film wettability and adhesion between a polymer and an organic semiconductor are better than those between an organic semiconductor and an inorganic insulating film material such as an inorganic oxide, whereby an organic semiconductor film with less traps will be formed. A polymer material having low polarity and low water absorptivity is preferred.

(5) A transistor is subjected to an aging treatment.

In a case where deep traps are due to structural defects, the material structure is sufficiently relaxed by an aging treatment thereby to reduce the traps. For such an aging treatment, it is effective to leave the transistor to stand for a long time or to heat it, and in addition, to place the transistor in a state where charges are present by practically applying a current for a long time.

The efficiencies of these means are different depending upon the material, and by combination of such means, desired characteristics will be obtained in many cases. It is preferred to combine as many means as possible, but it is possible to select appropriate means in view of balance between cost and other processes for preparation of the device.

Now each constituting element in the field effect transistor of the present invention will be explained below.

Support Substrate

In the field effect transistor of the present invention, as the support substrate, one employed for a conventional field effect transistor can be employed.

The material of the support substrate in the present invention is not particularly limited so long as it can support the field effect transistor, and a display device, a display panel or the like to be prepared on the transistor. It may be a known inorganic material such as glass, silicon oxide or a metal of e.g. silicon, or an organic material such as an organic polymer. These materials may be used in combination of two or more of them including combination of an inorganic material and an organic material such as a substrate made of an inorganic material, the surface of which is coated with e.g. an organic polymer to form an insulating layer on its surface. The organic polymer may, for example, be a polyester, a polycarbonate, a polyimide, a polyamide, a polyether sulfone, an epoxy resin, a polybenzoxazole, a polybenzothiazole, a polyparabanic acid, a polysilsesquioxane or a polyolefin. Among them, a condensed polymer such as a polyester such as polyethylene terephthalate, a polycarbonate, a polyimide, a polyamide, a polybenzoxazole, a polybenzothiazole or a polyparabanic acid, or a crosslinked product of e.g. a polyvinyl phenol is preferred in view of heat resistance and solvent resistance. A polyester, a polycarbonate, a polyimide or a polybenzoxazole is more preferred, and a polyester such as polyethylene terephthalate or a polyimide is particularly preferred. Such an organic polymer may contain a bulking agent or an additive as the case requires.

The thickness of the substrate by the above substrate material is preferably within a range of from 0.01 to 10 mm, particularly preferably within a range of from 0.05 to 2 mm. Within this range, in a case of an organic polymer substrate, the thickness is preferably from about 0.05 to about 0.1 mm, and in a case of a glass or silicon substrate or the like, the thickness is preferably from about 0.1 to about 10 mm. Further, the substrate may be a laminate consisting of a plurality of layers.

Further, in the present invention, an organic semiconductor portion as described hereinafter is formed by employing an organic semiconductor solution e.g. by application of the solution, and a field effect transistor production process at a relatively low temperature is employed. Accordingly, a film or the like of an organic polymer inferior in heat resistance and the like to an inorganic material is likely to be employed as a support substrate. In such a case, a field effect transistor which is light in weight as compared with an inorganic material and excellent in flexibility, and excellent also in impact resistance can be obtained.

Further, to the surface of such a substrate, a surface treatment may be applied to change characteristics of a layer to be formed thereon e.g. by adjusting the balance between hydrophilicity and hydrophobicity. For example, characteristics of the semiconductor portion significantly change depending upon the alignment state of molecules or the like, and accordingly the molecular alignment at the interfacial portion between the substrate and the semiconductor portion is controlled by the surface treatment on the substrate, and the characteristics can be improved. As a means of such a surface treatment on the substrate, a treatment to make the surface be hydrophobic by e.g. hexamethyldisilazane, cyclohexane or octadecyltrichlorosilane, an acid treatment by e.g. hydrochloric acid, sulfuric acid or acetic acid, an alkali treatment by e.g. sodium hydroxide, potassium hydroxide, calcium hydroxide or ammonia, an ozone treatment, a fluorinating treatment, a plasma treatment by e.g. oxygen or argon, a treatment to form a Langmuir-Blodgett film, a treatment to form a thin film of e.g. another insulant or a semiconductor, an electrical treatment such as corona discharge or mechanical treatment may, for example, be mentioned.

Gate Electrode

For the field effect transistor of the present invention, as a material of the gate electrode, an electrically conductive material which is used for a conventional field effect transistor may be employed. It may, for examples be a metal such as platinum gold, aluminum chromium, nickel, copper, titanium, magnesium, calcium, barium or sodium; an electrically conductive metal oxide such as $InO_2$, $SnO_2$ or ITO; an electrically conductive polymer such as a polyaniline, a polypyrrol, a polythiophene or a polyacetylene; or such a material doped with a dopant such as an acid such as hydrochloric acid, sulfuric acid or sulfonic acid, a Lewis acid such as $PF_5$, $AsF_5$ or $FeCl_3$, a halogen atom such as iodine, or a metal element such as sodium or potassium; or an electrically conductive composite material having carbon black, a graphite powder, fine metal particles or the like dispersed in a binder.

The gate electrode by such an electrically conductive material is formed by patterning a film formed by a vacuum deposition method, a sputtering method, a coating method, a printing method, a sol-gel method or the like into a desired shape as the case requires. The patterning method may, for example, be a photolithography method combining patterning of a photoresist with etching such as wet etching by means of an etching liquid or dry etching by means of reactive plasma, a printing method such as ink jet printing, screen printing, offset printing or relief printing, a soft lithography means such as a micro contact printing method, or a means in combination of a plurality of such means. Further, it is possible to directly form a pattern by applying energy rays such as electron beams or a laser to remove the material or by changing the electrical conductivity of the material.

The thickness of such a gate electrode is preferably at least 1 nm, particularly preferably at least 10 nm. Further, it is preferably at most 100 nm, particularly preferably at most 50 nm.

Source Electrode Drain Electrode

The source electrode is an electrode into which charge carriers flow from the outside via the wiring, and the drain electrode is an electrode from which charge carriers are drained to the outside via the wiring, and they are provided so as to contact an organic semiconductor portion as described hereinafter. In the field effect transistor of the present invention, as the material of the source electrode and the drain electrode, an electrically conductive material which is used for a conventional field effect transistor may be employed, and the same materials as mentioned as the material of the gate electrode may, for example, be mentioned.

Further, the source electrode and the drain electrode from such an electrically conductive material are formed by the same film formation method and patterning method as the above-mentioned film formation method for the gate electrode and patterning method as the case requires. Further, it is also possible to directly prepare a pattern by removing a portion other than the electrode by applying energy rays such as a laser or an electron beam or by changing the electrical conductivity of the electrode material. Among them as a patterning method on the source electrode and the drain electrode, a method by means of a photolithography method is preferred. The photolithography method may be a method of forming a film by an electrode material and removing a portion other than the electrode of the formed film by etching, or a method of forming a pattern e.g. by coating a portion other than the electrode with e.g. a resist, depositing thereon a film of the electrode material, and dissolving the resist or the like by a solvent to which the resist or the like is soluble to remove the electrode material formed on the resist (lift-off method).

Further, the thickness of the source electrode and the drain electrode is also preferably at least 1 nm, particularly preferably at least 10 nm. Further, it is preferably at most 100 nm, particularly preferably at most 5 nm. The source electrode and the drain electrode are formed preferably with a distance therebetween (channel length L) of at most 100 μm, particularly preferably at most 50 μm. They are formed preferably with a channel width W of at most 2000 μm, particularly preferably at most 500 μm. They are formed preferably with a L/w of at most 0.1 particularly preferably at most 0.05.

Gate Insulation Portion

In the field effect transistor of the present invention, the gate insulation portion has such a function that an overlapping region between the source electrode and the gate electrode, and between the drain electrode and the gate electrode, and the channel region on the gate electrode are maintained as an electrically insulating region. The electrical insulation means an electrical conductivity of at most $10^{-9}$ S/cm.

In the present invention, as the material of the gate insulation portion, a material which is used for a conventional field effect transistor may be employed. It may, for example, be an organic material such as an organic polymer such as a polymethyl methacrylate, a polystyrene, a polyvinyl phenol, a polyvinyl alcohol, a polyvinyl acetate, a polycarbonate, a polyester, a polysulfone, a polybenzoxazole, a polyimide, a polyurethane, an epoxy resin, a phenol resin or a polysilsesquioxane, or an inorganic material such as an oxide such as silicon dioxide, aluminum oxide or titanium oxide, a nitride such as silicon nitride or a ferroelectric oxide such as $SrTiO_3$ or $BaTiO_3$, and the inorganic material is preferably silicon dioxide.

Among the gate insulation portion materials, particularly preferred is an organic material, more preferred is a polymer material. The polymer material is usually one having a number average molecular weight of at least 5,000, preferably at least 10,000. Among the polymer materials a polyimide material or styrene is preferred, which is excellent in solvent resistance and heat resistance, and more preferred is a polyimide material containing fluorine atoms with small water absorptivity.

The organic material is preferably one having a glass transition point of at least 80° C. in view of fluidity as a solution at the time of formation of the layer.

The gate insulation portion material contains preferably at least 5 wt %, more preferably at least 15 wt % particularly preferably at least 50 wt %, most preferably at least 90 wt % of the organic material in view of brittleness, film strength, etc. as the gate insulation portion. A mixture of an organic material with an inorganic material is also employed and it may, for example, be the above organic polymer having particles of the above oxide, nitride, ferroelectric oxide or the like dispersed.

The coefficient of water absorption of the insulation portion is preferably low, and it is preferably at most 1 mg/cm$^3$, more preferably at most 0.65 mg/cm$^3$. If the coefficient of water absorption is too high, such problems may arise that the on-off ratio tends to be low, or no high mobility will be obtained, when the insulation portion is combined with the organic semiconductor.

Further, preferred is one which is soluble in a solvent in which the support substrate is not dissolved and which has solvent resistance so that it is not eroded by a solvent to be used for formation of the organic semiconductor portion as described hereinafter.

The gate insulation portion can be formed by a method depending upon the material characteristics including a coating method such as spin coating or blade coating a vapor deposition method, a sputtering method, a printing method such as screen printing or ink jet printings a method of forming an oxide film on a metal such as alumite on aluminum.

The thickness of the gate insulation portion is preferably at least 0.1 μm, particularly preferably at least 0.2 μm since a leak current may be generated if the film is too thin. Further, it is preferably at most 4 μm, particularly preferably at most 2 μm, since if the film is too thick the capacity as the gate insulation portion tends to decrease and the carrier induction amount at the time of application of the gate voltage tends to decrease.

In general the transistor can be driven at a lower gate voltage as the capacitance of the gate insulation portion increases, such being advantageous. This can be achieved by employing an insulating material having a high dielectric constant or by making the insulation portion thin. The gate insulation portion has an electrical conductivity at room temperature of preferably at most $10^{-12}$ S/cm, more preferably at most $10^{-14}$ S/cm and a relative dielectric constant of preferably at least 2.0, more preferably at least 2.5, since it relates to the leak current to the gate electrode, and the low gate voltage driving of the field effect transistor.

In the above description, the change in the threshold voltage attributable to a semiconductor is mainly noted, and control of the trap of the semiconductor attributable to the insulating film has been explained. Some of the change in the threshold voltage is caused by a reason relating only to the insulating film, in addition to one relating to the semiconductor material. Such a change is by a change in the dielectric characteristics and the charge distribution in the insulating film. When a voltage is applied to the gate electrode for a long time, the direction of dipoles (such as polar groups contained in the polymer) in the Insulating film may change or easily mobile ions contained in the insulating film move to change the charge distribution in the inside during the long period of time, whereby a change in the threshold voltage occurs. As characteristics of the insulating film to be combined, in addition to the above-mentioned characteristics, a sufficiently low concentration of impurity ions (such as at most 10 ppm), and the insulating film being sufficiently hard at a temperature near room temperature (the softening point and the glass transition temperature being sufficiently higher than room temperature) are preferred Organic Semiconductor Portion In the field effect transistor of the present invention, the organic semiconductor portion is not particularly limited, but preferably its mobility is at least 0.01 cm$^2$/(V·s) more preferably at least 0.1 cm$^2$/(V·s). Furthermore preferably, the mobility is at least 1.0 cm$^2$/(V·s).

The mobility (μ) of the semiconductor portion in the field effect transistor is obtained, based on the following formula (1) representing the drain current ($I_d$) in a pinch-off region where the drain voltage ($V_d$) is higher than the gate voltage ($V_g$):

$$I_d = [WC_i/(2L)]\mu(V_g - V_t)^2 \quad (1)$$

wherein $C_i$ is the capacitance per unit area of the gate insulation portion, X is the distance between the source electrode and the drain electrode (channel length), W is the channel width, $V_g$ is the gate voltage and $V_t$ is the threshold voltage by measuring the change in $I_d$ relative to different Vg, as a slope in a graph obtained by plotting $I_d^{1/2}$ and $V_g$.

It has been known that when field effect transistors having organic semiconductor portions with different μ are driven as a switching device, a display device can not be driven unless the value of the ratio (V/V$_{on}$) of the voltage (V) to be applied to the display pixels to the driving voltage (V$_{on}$) of the display pixels is sufficiently high, specifically at least 0.99, in three types of display devices including liquid crystal (LCD), paper-like display (PD) and digital paper (DP).

With respect to the drain current $I_d$ (equal to the current which is supplied to the display pixels) of a switching device, from the known following formula:

$$I_d = C_{px} \cdot \partial V/\partial t = \mu(W/L)C_i(V_{on} V)(V_g - V_t)$$

wherein $C_{px}$ is the capacitance of the display pixels, V is the voltage applied to the display pixels at the time t, μ is the mobility, W is the channel width, L is the channel length, $C_i$ is the capacitance of the gate insulation portion per unit area, $V_g$ is the voltage applied to the gate insulation portion, and $V_t$ is the threshold voltage of the organic semiconductor portion, the following formula:

$$\partial V/(V_{on} - V) = \mu(W/L)(C_i/C_{px})(V_g - V_t)\partial t$$

is introduced, and by integrating it, the following formula:

$$\int [1/(V_{on} - V)]dV = \int \mu(W/L)(C_i/C_{px})(V_g - V_t)dt$$

is obtained, and the integration constant is determined from conditions where V=0 when t=0 from the above formula, and resultingly, the formula (3) is obtained:

$$V = V_{on}[1 - \exp(-t/\tau)] \quad (3)$$

In the formula (3)

$$\tau = 1/[\mu(W/L)(C_i/C_{px})(V_g - V_t)]$$

Figure 3:
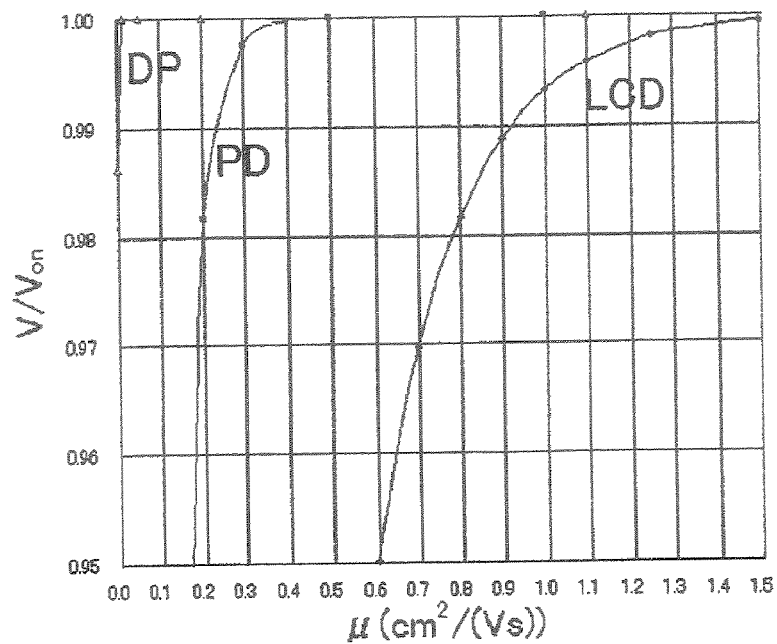
FIG. 3 is a graph illustrating the ratio ($V/V_{on}$) of the voltage (V) to be applied to display pixels to the driving voltage ($V_{on}$) of the display pixels, when field effect transistors having organic semiconductor portions having different mobilities μ are employed for three types of display devices, liquid crystal display (LCD), paper-like display (PD) and digital paper (DP).

From the above results, it is found how the value V/V$_{on}$ changes when field effect transistors having organic semiconductor portions with different μ are employed for driving circuits of three types of display devices. The results obtained by application to practical display devices are shown in FIG. 3. In LCD, PD and DP, (the frame frequency (Hz), the number of lines (lines)) are (60, 1,000), (60, 1,000) and (5, 2,000), respectively. As evident from FIG. 3, it is found that driving of LCD is also possible when $\mu \geq 1.0$ cm$^2$/(V·s).

In the present invention, a method of making the mobility of the organic semiconductor portion be at least 1.0 cm$^2$/(V·s) will be explained below. Shallow traps present among crystal particles in the polycrystals are considered as a factor which decreases the mobility. Shallow traps are formed from the above reason as the above-explained deep traps, and since the traps are shallow, charges can thermally escape therefrom, which influences over charge transport and thereby influences over the mobility Namely, it takes long for the charges trapped in the shallow traps to escape from the traps, and the mobility tends to be low. Further, if the barrier at the interface between the electrode and the semiconductor is too high to inject a sufficient current from the semiconductor, the apparent mobility may be low in some cases. Accordingly it is required to suitably select the material, the shape and the like of the electrode.

(1) An organic semiconductor material having a high purity is used.

In order to reduce shallow traps derived from impurities, an organic material having a high purity is used. The purity is preferably at least 95 wt %, more preferably at least 97 wt %.

(2) The sizes of particle grains are increased to reduce the junction points between the particles.

For example, it is considered that the junction points themselves between particles are reduced by selecting an organic semiconductor material the crystal grains of which tend to be large, or by selecting such film formation conditions under which the crystal grains tend to be large. Traps present between crystal particles are controlled.

(3) In a device having a bottom gate structure, an organic polymer is used for an insulating film and an organic semiconductor is formed thereon.

It is considered that in production of a film of an organic semiconductor on an organic polymer insulating film, wettability and adhesion between a polymer and an organic semiconductor are more favorable than those between an organic semiconductor and an inorganic insulating film material such as an inorganic oxide, whereby an organic semiconductor film with less traps will be formed. A polymer material having low polarity and low water absorptivity is preferred. An organic polymer is used for the insulating film.

(4) Combination with an appropriate electrode

An electrode is combined so that injection of charges from the electrode into the semiconductor will be easily carried out. For example, for injection of holes, a material such as gold, platinum or ITO with a high work function is selected. Further, in photolithography, patterning with metal etching is preferred to the lift-off which is likely to generate burrs, so that there would be no edge portions (burrs) which are protrusions in the form of the electrode.

The organic semiconductor portion of the field effect transistor of the present invention is not particularly limited, and its material may, for example, be an oligothiophene containing four or more thiophene rings, such as α-sexithiophene or dialkylsexithiophene, one having Four or more rings connected in total, the rings being selected from thiophene rings, benzene rings, fluorene rings, naphthalene rings, anthracene rings, thiazole rings, thiadiazole rings and benzothiazole rings, a condensed aromatic hydrocarbon such as naphthalene, pentacene, pyrene, perylene or fullerene; a condensed thiophene or its derivative such as anthradithiophene, dibenzothienobisthiophene or α,α'-bis(dithieno[3,2-b':2',3'-d]thiophene); an aromatic carboxylic anhydride or its imidated product such as naphthalenetetracarboxylic anhydride, naphthalenetetracarboxylic diimide, perylenetetracarboxylic anhydride or perylenetetracarboxylic diimide; a macrocyclic compound such as phthalocyanine, perfluorophthalocyanine, tetrabenzoporphyrin or its metal salt of e.g. copper or zinc; a polythiophene, a polyfluorene, a polythienylenevinylene, a polyphenylenevinylene, a polyphenylene, a polyacetylene, a polypyrrole or a polyaniline, particularly a polymer exhibiting self-organizing properties such as a regioregular polythiophene or a polymer exhibiting liquid crystallinity such as a polyfluorene or its copolymer.

Among them, cyclic azaannulene compounds represented by phthalocyanine, naphthalocyanine, porphyrin, benzoporphyrin, azaporphyrin, thiaporphyrin, oxaporphyrin, confused porphyrin, etc. are preferred.

Among them, a macrocyclic compound such as phthalocyanine perfluorophthalocyanine, tetrabenzoporphyrin or its metal salt of e.g. copper or zinc is preferred and a metal coordination porphyrin compound represented by the following formula is particularly preferred:

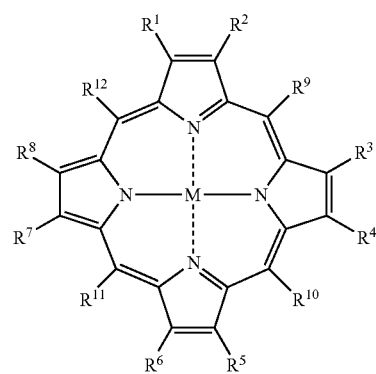

wherein each of $R^1$, $R^2 R^3$, $R^4$, $R^5$, $R^6$, $R^7$ and $R^8$ which are independent of one another, is a hydrogen atom, a hydroxyl group, an amino group which may have a substituent, a nitro group, a monovalent organic group or a halogen atom each of $R^9$, $R^{10}$, $R^{11}$ and $R^{12}$ which are independent of one another is a hydrogen atom, a monovalent organic group or a halogen atom, and M is a metal atom.

In the above formula, the substituent of the amino group as each of $R^1$ to $R^8$ may, for example, be a $C_{1-10}$ alkyl group. The monovalent organic group as each of $R^1$ to $R^8$ preferably has from 1 to 10 carbon atoms, specifically, it may for example, be an alkyl group, an alkoxy group, an alkylthio group, an acyl group, an ester group of a carboxyl group with a $C_{1-10}$ alcohol, a formyl group or a carbamoyl group and these organic groups may have a substituent. The halogen atom as each of $R^1$ to $R^8$ may, for example, be a fluorine atom, a chlorine atom, a bromine atom or an iodine atom.

Further, adjacent $R^1$ and $R^2$, $R^3$ and $R^4$, $R^5$ and $R^6$, or $R^7$ and $R^8$, may be bonded to form a ring, and in such a case, the ring to be formed may, for example, be an aromatic ring such as a benzene ring, a naphthalene ring or an anthracene ring; a heterocyclic ring such as a pyridine ring, a quinoline ring, a furan ring or a thiophene ring; or an alicyclic ring such as a cyclohexane ring.

The monovalent organic group as each of $R^9$ to $R^{12}$ may, for example, be an alkyl group, an alkoxy group, an alkylthio group, an ester group of a carboxyl group with a $C_{1-10}$ alcohol, or an aryl group, and such organic groups may have a substituent. The halogen atom as each of $R^9$ to $R^{12}$ may, for example, be a fluorine atom, a chlorine atom, a bromine atom or an iodine atom.

The metal atom as M is preferably Cu, Ni, Fe or Zn, particularly preferably Cu. Examples of a preferred compound of the above formula wherein M is Cu are shown below. Compounds having a molecular structure with good symmetry are mainly shown, but compounds having an asymmetric structure may also be employed:

13
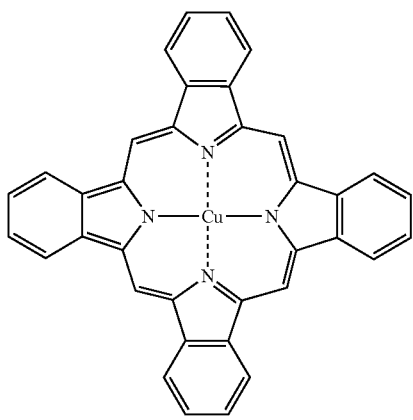
14
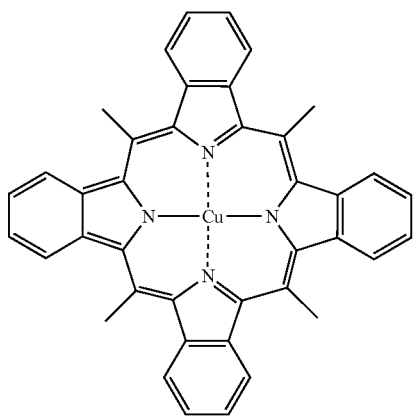
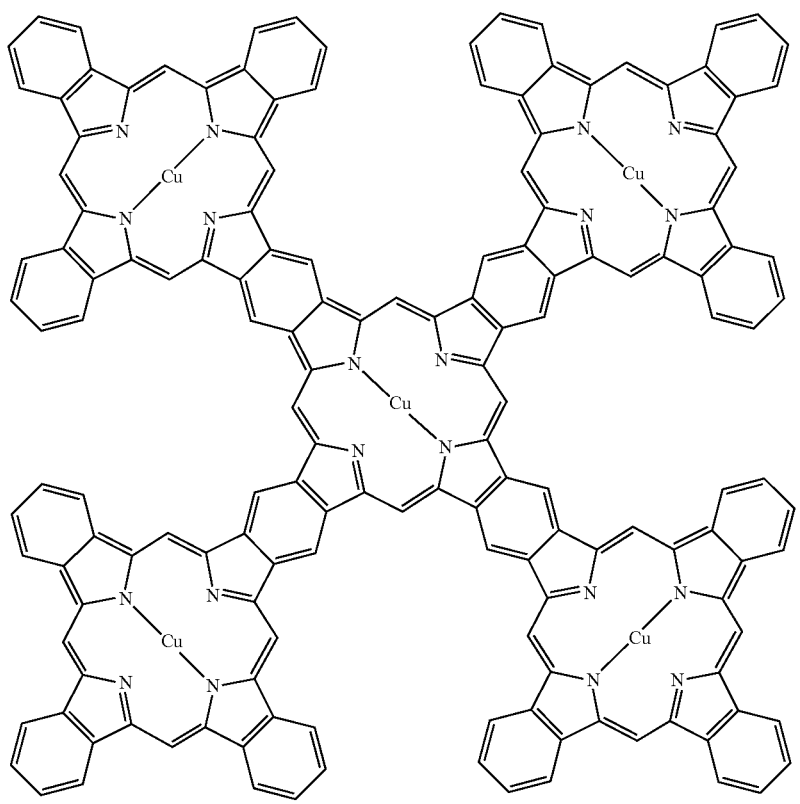
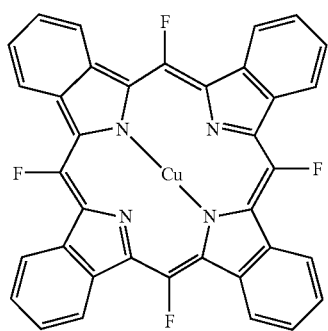

The above metal coordinate porphyrin compounds may be used alone or as a mixture of two or more of them. Various additives such as an antioxidant may be added to the organic semiconductor portion.

The organic semiconductor portion in the field effect transistor of the present invention is formed by forming a solution layer employing a solution of the organic semiconductor by means of a coating method, a printing method or the like, followed by drying.

The solvent to be used is not particularly limited so long as the organic semiconductor is dissolved therein, and an optional solvent may be used depending upon the type of the organic semiconductor, etc.

Further, the method of forming a layer of the solution is not particularly limited, and a coating method such as casting, spin coating dipping, blade coating, wire bar coating or spray coating, a printing method such as ink jet printing, screen printing, offset printing or relief printing, or a soft lithography method such as micro contact printing, may, for example, be mentioned. Further, two or more such means may suitably be combined. Further, as a means similar to coating, a Langmuir-Blodgett method wherein a monolayer film of the semiconductor material formed on water is transferred to a substrate and laminated, or a method of sandwiching a liquid crystal or a molten state semiconductor material between two substrates or introducing it between two substrates by capillarity may, for example, be mentioned.

In a case where the organic semiconductor portion of a metal coordination porphyrin compound is formed by the above method, in addition to a method of e.g. applying a solution having the metal coordination porphyrin compound itself dissolved in a solvent, such a method may also be employed that a precursor of the metal coordination porphyrin compound is dissolved in a solvent to prepare a precursor solution, the precursor solution is applied, and then the chemical structure of the precursor is converted into a final metal coordination porphyrin compound thereby to form a semiconductor portion. This method is effective particularly when an organic semiconductor portion of a metal coordination porphyrin compound which is hardly soluble in a solvent is to be formed.

In a case where an organic semiconductor portion of the metal coordination porphyrin compound is to be formed employing a precursor, the precursor may, for example, be a metal coordination porphyrin compound having the following bicycle structure, in which ethylene molecules are dissociated by heating to form a benzene ring. The two bonds in the following bicyclo structure and the benzene ring converted therefrom are bonds which connect to porphyrin:

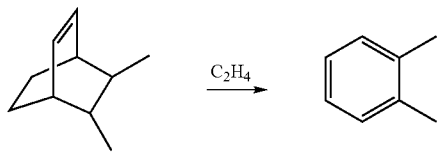

The bicycle structure is sterically bulky and thereby has low crystallinity. Accordingly, molecules having a bicycle structure has favorable solubility, and when its solution is applied, a coating film with low crystallinity or an amorphous coating film is likely to be obtained. Further, when the bicycle structure is converted into a benzene ring via the heating process, which has a molecular structure with favorable planarity and thereby has favorable crystallinity. Accordingly, by utilizing a chemical change from a precursor having a bicyclo structure, even in a case where a porphyrin compound having a low solubility in a solvent is employed to form an organic semiconductor portion from a solution/an organic semiconductor portion made of a porphyrin compound with good crystallinity can be obtained e.g. by coating Heating to convert the precursor into a final porphyrin compound may also function to evaporate the coating solvent off, or may have another function.

In general, it is considered that by formation of an organic semiconductor portion employing a solution, no high film formation properties will be obtained, and an organic semiconductor portion having high crystallinity is hardly obtained. However, by the above method of employing a precursor, an organic semiconductor portion having excellent characteristics such as high crystallinity can be obtained employing a solution. Further, a field effect transistor having an organic semiconductor portion thus formed has preferred characteristics such as a high carrier mobility and a high on/off ratio. The above method of employing a precursor is a method applicable to other organic semiconductor materials in general, not limited to a porphyrin compound.

The solvent for coating such a precursor is not particularly limited, and it may, for example be an aliphatic hydrocarbon such as hexane, heptane, octane, isooctane, nonane or decane; an aromatic hydrocarbon such as toluene, benzene, xylene, chlorobenzene, tetralin or anisole; a lower alcohol such as methanol, ethanol, propanol or butanol; a ketone such as acetone, methyl ethyl ketone cyclopentanone or cyclohexanone; an ester such as ethyl acetate, butyl acetate, methyl lactate or ethyl benzoate; a nitrogen-containing organic solvent such as pyridine or quinoline; a halogenated hydrocarbon such as chloroform, methylene chloride, dichloroethane, trichloroethane or trichloroethylene; an ether such as ethyl ether, tetrahydrofuran, dioxane or dimethoxyethane; or an amide such as dimethylformamide or dimethylacetamide. Among them, preferred is an aromatic hydrocarbon, a ketone or an ester in view of safety, handling efficiency and easiness of combination with various coating methods. Further, it is also possible to mix two or more solvents when physical properties such as the boiling point and the viscosity are adjusted.

As an example of the precursor of the porphyrin compound, a benzoporphyrin compound comprising a pyrrol ring and a benzene ring condensed is formed from a precursor having a bicyclo structure, whereby it is advantageous for formation of an organic semiconductor portion e.g. by coating by means of the above method.

In a case where the organic semiconductor portion is formed by employing a precursor by repeatedly carrying out application of the precursor solution, a formation step e.g. by coating or printing and a step of changing the chemical structure e.g. by heating it is possible to laminate films of the organic semiconductor portion so that it is not dissolved in the precursor solution thereby to form a thick film, employing a difference in solubility between the precursor and the organic semiconductor material.

As a means to control the direction of the crystals in the organic semiconductor portion a means such as an epitaxial growth method or rubbing after coating may be employed. Such a means makes it possible to improve the carrier mobility of the semiconductor layer and to decrease the electrical resistivity of the channel.

Further, to the organic semiconductor portion, impurities such as a very small amount of element or atoms, molecules or polymers may be incorporated for the purpose of changing the characteristics of the semiconductor portion, that is, the organic semiconductor portion may be so-called doped. In such a case, the doping method may optionally be selected from known means depending upon the characteristics and the like of the organic semiconductor portion to be formed. Specifically, the dopant may, for example, be a gas of oxygen, hydrogen or the like, an acid such as hydrochloric acid, sulfuric acid or sulfonic acid, a Lewis acid such as $PF_5$, $AsF_5$ or $FeCl_3$, a halogen atom such as iodine, or a metal atom such as sodium or potassium.

Further, the doping method may, for example, be a method wherein treatment is carried out before formation of the organic semiconductor portion in which the dopant is mixed with the solution of the organic semiconductor material or the precursor, or the solution is brought into contact with or immersed in a gas or a solution of such a dopant at a step of forming the precursor portion, or a method wherein treatment is carried out after formation of the organic semiconductor portion, in which the organic semiconductor portion formed is brought into contact with or immersed in a gas or a solution of the dopant, or an electrochemical treatment is applied.

By the doping treatment, effects such as a change in the electrical conductivity by an increase or a decrease in the carrier density, a change in the polarity (p-type or n-type) of the carrier, a change in the Fermi level are achieved.

The organic semiconductor portion thus formed may be subjected to a post-treatment such as a heat treatment to absorb the stress in the semiconductor portion induced during the film formation, exposure to an oxidizing or reducing gas or liquid such as oxygen or hydrogen, to induce changes in characteristics by oxidation or reduction thereby to increase or decrease the carrier density in the semiconductor portion, a mechanical treatments or an electrical treatment such as corona discharge.

In the field effect transistor of the present invention, the organic semiconductor portion may be formed by a single layer or may be formed by two or more layers. The film thickness of the organic semiconductor portion is preferably as thin as possible within a range where required functions are fulfilled, since the leak current tends to increase as the thickness increases. The film thickness is preferably at most 10 μm, more preferably at most 1 μm, particularly preferably at most 500 nm, most preferably at most 50 nm. Further, it is preferably at least 1 nm, more preferably at least 5 nm, particularly preferably at least 10 nm.

The field effect transistor of the present invention preferably satisfies both the following (a) and (b).

(a) The change in the threshold voltage is within 5 V when a voltage is applied to the gate at 70° C. for 5.0±0.1 hours so that the field strength in the gate insulation portion would be 100±5 MV/m.

(b) The organic semiconductor portion is formed by employing an organic semiconductor solution, and the mobility of the organic semiconductor portion is at least 1.0 $cm^2$/(V·s).

A small change in the threshold voltage by driving and a high mobility are preferred since a device can be designed with a good margin. Namely, a small transistor (with a narrow gate width) and which requires no or a simple correction circuit for a change in the threshold voltage, will be obtained. Further, in a case where a voltage driving type device such as organic EL is driven, the transistor can be advantageously utilized also for such a device that a large current is conducted and further, a voltage is always applied to the gate as different from an active matrix liquid crystal display transistor. Further, in a case where the transistor is to be used not only for a display but also for a driver circuit, preferred is one which stably both (a) and (b) This is because a fast response and a higher stability are required for a driver circuit than those of a display.

Even when only one of the above is satisfied, it is possible to obtain a practically usable one in some cases by designing the structure (gate width and length) of the transistor with a good margin. However, an enlarged transistor portion leads to a decrease in the open area ratio, a short life, or an increase in the cost of a peripheral drive circuit, such being disadvantageous.

In order to obtain a field effect transistor satisfying both the above (a) and (b), the following means may be mentioned.

As explained above, in a case where both (a) and (b) are related to a semiconductor, although there is a difference in a degree of deepness and shallowness the traps are related. Accordingly, the method of decreasing the number of the traps or the method of removing the traps are in common, and thus the above object can be achieved by employing the above methods alone or in combination. Namely, A semiconductor material having a high purity is employed. Preferably, a semiconductor material having a purity of at least 95 wt %, more preferably at least 97 wt % is employed.

A semiconductor material is selected so that large crystal grains are formed, or a highly ordered structure can be formed.

An appropriate polymer insulating film is employed.

An appropriate overcoat is combined.

An aging treatment is carried out.

More preferably the following method is employed.

Such a material is employed that a film of a precursor is converted to obtain a crystalline low molecular semiconductor film.

An azaannulene compound is employed For the semiconductor material.

A metal electrode patterned by etching is employed.

Structure of Field Effect Transistor

Figure 1B:
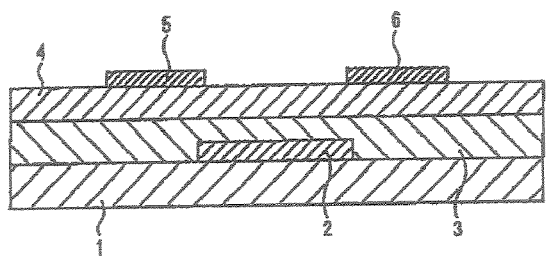
Figure 1C:
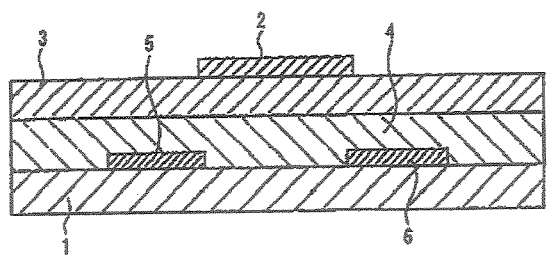
Figure 1D:
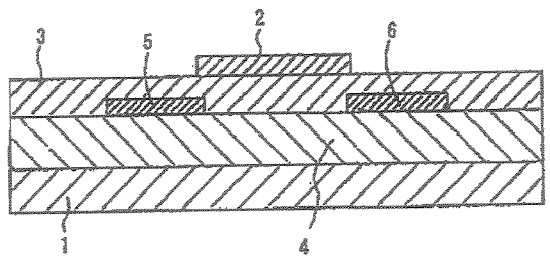

A basic structure of the field effect transistor of the present invention will be explained with reference to figures FIGS. 1(A) to 1(D) are vertical sectional views illustrating an example of a horizontal field effect transistor (referred to as "FET") among the field effect transistors of the present invention. In FIGS. 1(A) to 1(D), the field effect transistor of the present invention comprises a support substrate 1, and a gate insulation portion 3, a gate electrode 2 and an organic semiconductor portion 4 separated by the gate insulation portion 3, and a source electrode 5 and a drain electrode 6 provided so as to contact the organic semiconductor portion 4, formed on the support substrate 1. The structure is not particularly limited, and typically, the structure may, for example, be a bottom gate/bottom contact type as shown in FIG. 1(A), a bottom gate/top contact type as shown in FIG. 1(B), a top gate/bottom contact type as shown in FIG. 1(C) or a top gate/top contact type as shown in FIG. 1(D).

Figure 2:
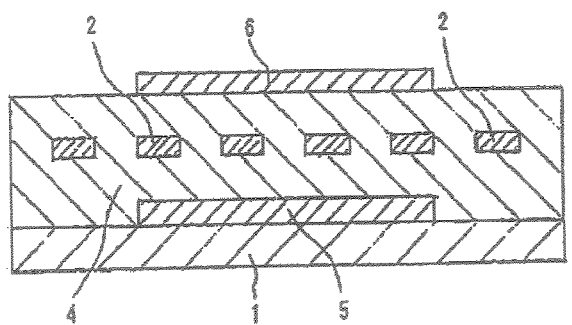
FIG. 2 is a vertical sectional view illustrating an example of a static induction transistor (SIT) among field effect transistors of the present invention.

Further, FIG. 2 is a vertical sectional view illustrating an example of a static induction transistor (referred to as "SIT") among the field effect transistors of the present invention. In the above-described FET, the source electrode 5 and the drain electrode 6 are disposed on the support substrate 1 in parallel with each other, and the direction of the current flow is at right angles to the field induced by the gate electrode 2. On the contrary, SIT is different from the above-described FET in that a source electrode 5 and a drain electrode 6 are arranged in a column on a support substrate 1 with an organic semiconductor portion 4 sandwiched therebetween, gate electrodes 2 insulated by a gate insulation portion 3 (not shown) are arranged with a predetermined distance in a network pattern, a stripe pattern or a lattice pattern on the organic semiconductor portion 4 sandwiched between the electrodes, and the direction of the current flow is in parallel with the field induced by the gate electrode 2.

In the SIT the cross-sectional area of the channel as the total cross-sectional area of a plane at right angles with the source-drain direction of the channel region can be made large as compared with FET. Accordingly, a large amount of carriers can be transferred from the source electrode to the drain electrode or from the drain electrode to the source electrode at a time, and further, the source electrode and the drain electrode are arranged in a column, whereby the distance between the source electrode and the drain electrode can be reduced, and accordingly high speed response will be achieved, and such is favorable for an application in which a large current is flowed or high speed switching is carried out.

In the SIT, the distance between the gate electrodes 2 is optional, but it is usually preferably shorter than the distance between the source electrode 5 and the drain electrode 6 (thickness of the organic semiconductor portion 4). The thickness of the gate electrode 2 is preferably at least 10 nm, particularly preferably at least 20 nm, and preferably at most 10 µm, particularly preferably at most 1 µm.

The basic structure of the field effect transistor of the present invention is as described above, but the field effect transistor of the present invention is by no means restricted to the field effect transistors having structures as shown in FIGS. 1 and 2, and a layer other than the above layers may further be formed between the above components or as an outermost layer. For example, in a case of a field effect transistor of which the organic semiconductor portion 4 is exposed, such as the field effect transistor as shown in FIG. 1(A) or FIG. 1(B) in order to minimize the influence by the air such as moisture over the organic semiconductor portion 4, or to improve the characteristics themselves of the semiconductor, a protective layer is preferably further formed on the organic semiconductor portion 4. In such a case, the material of the protective layer may, for example, be a hydrocarbon polymer containing an aromatic group such as a polystyrene, a polyvinylnaphthalene, a poly(4-methylstyrene), a poly(α-methylstyrene) or a polyacenaphthylene, a methacrylic resin or an acrylic resin such as a polymethyl methacrylate or polybenzyl methacrylate, or an organic polymer or its copolymer such as a polyvinyl alcohol, a polyvinylidene chloride, a polyvinylidene fluoride, a polyolefin, a polyimide resin, a polyurethane resin, a polycarbonate resin, an epoxy resin or a fluororesin, a siloxane resin, or an inorganic substance such as an oxide or a nitride such as silicon oxide, aluminum oxide or silicon nitride. Among them, the protective layer to be formed so as to contact the semiconductor is preferably made of an organic polymer containing an aromatic ring, more preferably a polymer containing a benzene ring, particularly preferably a polystyrene. Further, it is possible to laminate such layers to achieve an effect of improving characteristics and gas barrier properties. Further, it is also possible to mix a low molecular compound and reacting it with the semiconductor film, thereby to control characteristics of the semiconductor film such as the carrier mobility and the carrier density.

As a method of forming the protective layer, various known methods may optionally be employed. In a case where the protective layer is made of an organic polymer, a method of applying its solution, followed by drying to obtain an organic polymer layer, a method of applying a monomer thereof, followed by polymerization to obtain a polymer layer, may, for example, be mentioned. Further, a post-treatment such as crosslinking treatment may suitably be carried out after film formation, or it is possible to employ a polymerization method to form a film while laminating the protective layers in a gas phase represented by parylene or polyimide. Further, in a case where the protective layer is made of an inorganic substance, a method employing a dry process such as a sputtering method, a vapor deposition method or a chemical vapor deposition method (CVD), or a method of employing a solution represented by a sol-gel method may, for example, be mentioned.

Further, in a case where the material constituting FET, particularly the organic semiconductor material to be used for the organic semiconductor portion, absorbs light to generate charges, it is possible to form a pattern with a small transmittance of light (so-called black matrix) by means of a film of a metal such as chromium, aluminum, silver or gold, a resin film having a pigment such as carbon black dispersed therein, or a film of an organic dye, at a desired region Voltage Application Treatment In the present invention, in order to prepare a field effect transistor with a change in the threshold voltage within 5 V, it is preferred to carry out a voltage application (aging) treatment. This treatment is carried out after the respective components of the field effect transistor are formed, and accordingly it is carried out by a long term treatment by applying a voltage under conditions close to the voltage stress practically applied to the field effect transistor. Treatment conditions such as the treatment temperature, the application voltage and the treatment time depend on the semiconductor material to be used, the gate insulating film material or the layer structure. However, the temperature is preferably higher, since the treatment time tends to be shortened, and the treatment is carried out preferably at a temperature of at least 20° C., more preferably at least 40° C., furthermore preferably at least 50° C. The device may deteriorate at a high temperature, and accordingly the treatment temperature is preferably at most 150° C., more preferably at most 100° C. The treatment time is, in the case of an inorganic insulating film, preferably at least 2 hours, more preferably at least 10 hours, furthermore preferably at least 50 hours, and in the case of a polymer insulating film, preferably at least one minute.

The mechanism of the aging treatment is not clearly understood, but is considered that there are components which irreversibly change the threshold voltage shift and component which reversively change the shift, and the aging sufficiently reduces the component which irreverseively change the shift, and such is effective to obtain a high driving stability. At the time of aging, it is preferred to apply both gate and drain voltages so that the drain current is conducted for aging. The reason is not clear, but it is estimated that the flowing current has an effect to remove portions (such as traps) which destabilize the threshold voltage.

The field effect transistor of the present invention preferably has an on/off ratio of at least 800, particularly preferably at least 1,000.

Application of Field Effect Transistor

The field effect transistor is used for an active matrix driving display device, and it is useful as a pixel switch for e.g. a liquid crystal display, a polymer dispersed liquid crystal display, an electrophoretic display, a toner display, an organic EL display, an inorganic EL display and a light-emitting diode display.

EXAMPLES

Now, the present invention will be explained in further detail with reference to Examples. However, the present invention is by no means restricted to the following Examples within a range not exceeding the scope of the present invention.

Preparation Example 1

Preparation of Bicycloporphyrin Copper Complex

In accordance with a method as disclosed in S. Ito; N. Ochi, T. Murashima, H. Uno, N. Ono, Heterocycles, vol. 52, 399 (2000), a copper bicycloporphyrin complex was prepared from bicycloporphyrin in the following route Namely, 92.8 mg (0.16 mmol) of bicycloporphyrin having the following structure and 313.6 mg (1.6 mmol) of coppery(II) acetate dihydrate were dissolved in a mixed liquid of chloroform 151 mL/methanol 15 mL, followed by stirring for about one hour. It was confirmed by alumina TLC (eluting solvent: chloroform/hexane=1/1) that the materials disappeared and a novel compound formed. Accordingly, water was added to terminate the reaction, washing with water was carried out as it was, and an organic layer was separated. Further, the organic layer was washed with a saturated salt solution and dried over anhydrous sodium sulfate. The drying agent was removed by filtration with a filter paper, and then the solvent was distilled off, chromatography (eluting solvent: chloroform/hexane=1/1) was carried out by using an alumina gel, and fractions containing only the aimed product alone were collected and concentrated. During the concentration, methanol was added, and the concentration was further continued, whereupon precipitates of the desired product formed. The precipitates were collected by filtration with a filter paper and vacuum dried. The amount of bicycloporphyrin copper complex thus obtained was 76.5 mg, and the yield was 75%.

Figure 4:
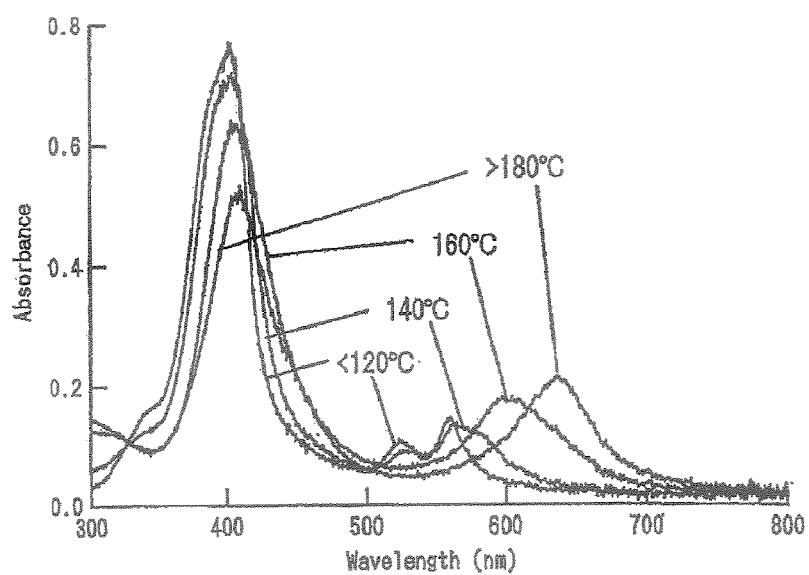
FIG. 4 illustrates absorption spectrum of a bicycloporphyrin copper complex used in Example 1 at a temperature of from 120 to 180° C.

0.8 mg of the obtained bicycloporphyrin copper complex was dissolved in 1.25 g of chloroform, and the solution was spin coated on a glass substrate at 2,000 rpm to form a film, and the obtained film was heated at 4° C./min to measure the absorption spectrum. The results are shown in FIG. 4. It is found from the results that the bicycloporphyrin copper complex was converted into a benzoporphyrin copper complex as shown below at a temperature within a range of from 120 to 180° C.

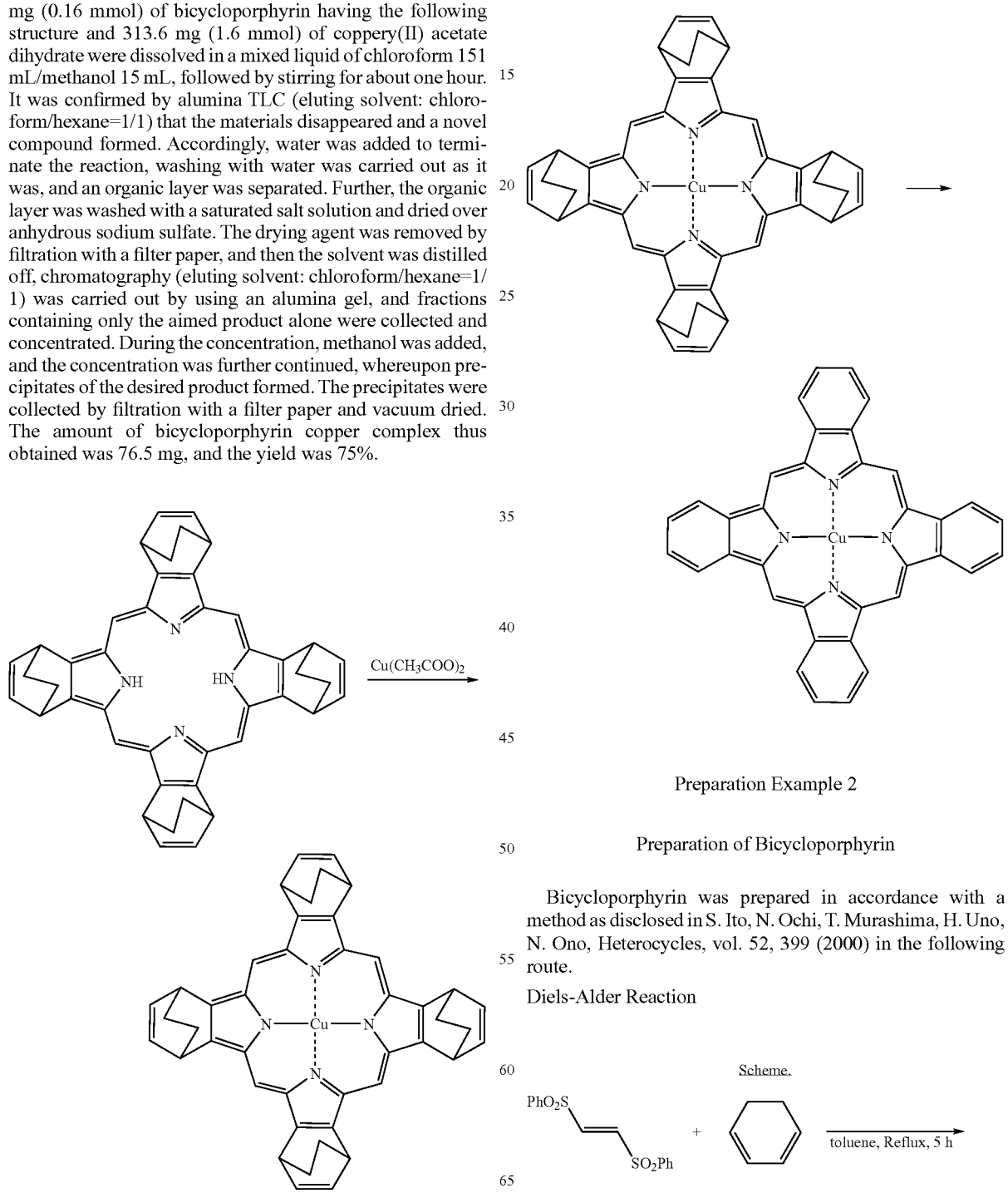

Preparation Example 2

Preparation of Bicycloporphyrin

Bicycloporphyrin was prepared in accordance with a method as disclosed in S. Ito, N. Ochi, T. Murashima, H. Uno, N. Ono, Heterocycles, vol. 52, 399 (2000) in the following route.

Diels-Alder Reaction

-continued

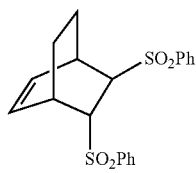

Into a 2 L four-necked flask equipped with a reflux condenser, trans-1,2-diphenylsulfonylethylene (52.74 g, 171 mmol) was put and dispersed in 1.6 L of toluene. Then, 1,3-cyclohexadiene (20.52 mL 205.2 mmol) was put in this solution, followed by reflux for 5 hours to carry out a heat diels-alder reaction. After completion of the reaction, vacuum concentration was carried out by an evaporator, followed by washing with hexane to obtain 72 g (yield: 99%) of 2-exo,3-endo-bis(phenylsulfonyl)bicyclo[2.2.2]oct-5-ene as an aimed product. As the measure of completion of the reaction the completion of the reaction was judged by complete dissolution of trans-1,2-diphenylsulfonylethylene as the material dispersed in toluene, and disappearance of the peak of the material at 1.939 minutes and appearance of the peak of the aimed product at 2.077 minutes by HPLC (column: CAPCELL PAK C18 MG S-5 μm, Column size: 4.6 mm I.D.×250 mm, eluent: THF 70 vol %; water 30 vol %).

Formation of Pyrrol

Scheme.

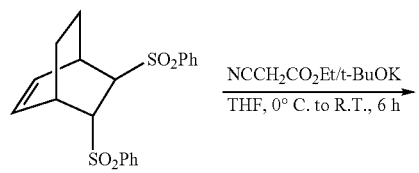

Into a 2 L Four-necked flask, 2-exo,3-endo-bis(phenylsulfonyl)bicyclo[2.2.2]oct-5-ene 54.32 g, 140 mmol) was added the system in the flask was replaced with nitrogen and 700 mL of dehydrated THF was added and dissolved. To this solution, isocyanoethylcarboxylate (17.01 g, 154 mmol) was added and cooled in ice bath (the internal temperature was set at 0° C.). To this cooled solution a t-BuOK/THF 1M solution (350 mL, 350 mmol) was slowly dropwise added at a dropping rate of 5 mL/min (the increase in the internal temperature was about 1° C. at the time of dropping). After completion of the dropwise addition the temperature of the reaction solution was recovered to room temperature followed by stirring for 6 hours. After stirring, 1N hydrochloric acid was added (the internal temperature increased by 3° C. by this addition), extraction with chloroform was carried out, the extract was washed with water, and the resulting organic layer was dried over anhydrous sodium sulfate and purified by silica gel column chromatography (chloroform) to obtain 24 g (yield. 79%) of ethyl 4,7-dihydro-4,7-ethano-2H-isoindole-1-carboxylate as an aimed product. As the measure of the completion of the reaction, the completion of the reaction was judged by disappearance of the peak of the material and appearance of the peak of the aimed product at 3.110 minutes by HPLC (column: CAPCELL PAK C18 MG S-5 μm, Column size: 4.6 mm I.D.×250 mm, eluent: THF 70 vol %; water 30 volt).

Reduction reaction by LiAlH$_4$

Scheme.

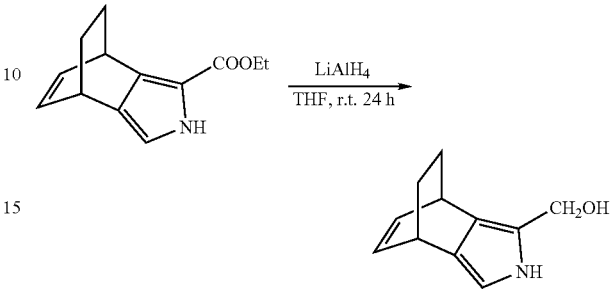

The system in a 100 mL four-necked flask was replaced with nitrogen and LiAlH$_4$ (0.646 g, 17.02 mmol) was weighed in the flask. 22 mL of THF was added to this flask. On this occasion, the flask was cooled with ice at 0° C. Then, bicyclopyrrol (1 g, 4.60 mmol) was dissolved in 30 mL of THF, and the solution was slowly added to the flask, followed by stirring. During the reaction, the temperature recovered to room temperature about 3 hours later. After initiation of stirring, the reaction state was traced by means of HPLC. 5 Hours later, the peak of an aimed product appeared, whereupon ethyl acetate was added to decompose the remaining LiAlH$_4$ thereby to complete the reaction. Then, extractions with an ammonium chloride aqueous solution and chloroform were carried out, and the resulting organic layer was dried over magnesium sulfate.

Cyclization of Pyrrol

Scheme 2.

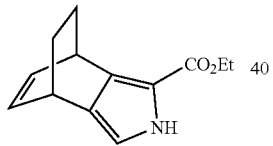

The chloroform solution extracted in the above experiment was further diluted so that the total volume would be 1.2 L. To this solution, p-toluene sulfonic acid monohydrate (0.368 g, 2.14 mmol) was added to carry out a cyclization reaction for 24 hours.

Oxidation Reaction

Scheme 3.

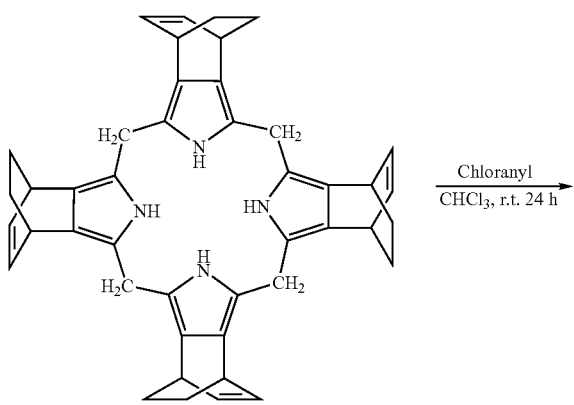

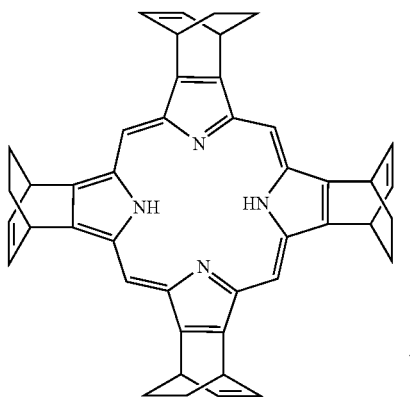

To the chloroform solution subjected to the cyclization reaction in the above experiment, chloranil (0566 g, 2.30 mmol) was added to carry out an oxidation reaction for 24 hours. After completion of the reactions extraction with a saturated sodium hydrogen carbonate aqueous solution, and the resulting chloroform layer was concentrated by an evaporator to obtain a crude product. The obtained crude product was dissolved in chloroform at a high concentration, purification by separation was carried out by means of silica gel column chromatography (chloroform as an eluting solvent), and recrystallization was further carried out in chloroform/methanol to obtain the bicycloporphyrin. The purity was confirmed by means of HPLC, MALDI-TOF-MASS and elemental analysis and found to be high purity.

Preparation Example 3

Preparation of Bicycloporphyrin Copper Complex

The same operation as in Preparation Example 1 was carried out except that chromatography by an alumina gel was not carried out in preparation of the bicycloporphyrin copper complex, to obtain a bicycloporphyrin copper complex Measurement of Purity of Organic Semiconductor Materials Purities of the porphyrin materials obtained in Preparation Examples 1 to 3 and pentacene (manufactured by TOKYO KASEI KOGYO Co., Ltd) were measured by means of CHN elemental analysis method. With respect to pentacene, one formed by sublimation was employed.

Purities of the organic semiconductors were measured by means of a combustion-thermal conductivity method employing as a CHN measuring apparatus PERKIN ELMER 2400 Series II CHN/O Analyzer. As a method of calculating the purity, each semiconductor was held in a vacuum of $10^{-5}$ Torr for 3 hours to remove the solvent and moisture so as to eliminate disturbance factors, and then subjected to CHN measurement. With respect to the obtained analyzed values, the carbon (C) atom which is an essential element for the organic semiconductor was noted and the purity was calculated as (the analyzed value)/(the theoretical value)×100=purity (%) and as a result, the following purity was obtained.

The results are shown in the following Table.

TABLE 1

| | | C | H | N | Purity (wt %) |
|---|---|---|---|---|---|
| Preparation example 1: benzoporphyrin copper complex | Theoretical value (%) | 77.22 | 5.3 | 8.19 | 97.3 |
| | Analytical value (%) | 75.17 | 4.71 | 7.85 | |
| Preparation example 2: benzoporphyrin | Theoretical value (%) | 84.85 | 6.15 | 9 | 97.7 |
| | Analytical value (%) | 82.92 | 5.71 | 8.69 | |
| Preparation example 3: benzoporphyrin copper complex | Theoretical value (%) | 77.22 | 5.3 | 8.19 | 92.4 |
| | Analytical value (%) | 71.36 | 4.68 | 7.32 | |
| Pentacene | Theoretical value (%) | 94.93 | 5.07 | | 99.6 |
| | Analytical value (%) | 94.56 | 4.45 | <0.3 | |

Preparation Example 4

Preparation of Polyamic Acid (Kapton Precursor)

2.0 g (10 mmol) of 4,4'-oxydianiline was dissolved in 42 mL of N-methyl-2-pyrrolidone at room temperature in nitrogen atmosphere. 2.2 g (10 mmol) of pyromellitic dianhydride was added to the solution to carry out ring-opening polyaddition reaction to carry out polymerization of polyamic acid as a polylmide precursor. 12 Hours after initiation of the polymerization the polymer solution was put in 500 mL of methanol to carry out reprecipitation to obtain polyamic acid. After vacuum drying, the polyamic acid was dissolved in N-methyl-2-pyrrolidone and reprecipitation with methanol was carried out again. This reprecipitation treatment was repeated two times to obtain polyamic acid as a purified kapton precursor.

Example 1

Patterning was carried out on an ITO glass plate (2.5 cm×2.5 cm, manufactured by HOWA SANGYO CO., LTD.) by using a photoresist (ZPN1100, manufactured by ZEON CORPORATION) then an unnecessary ITO was etched by means of a 1N hydrogen chloride aqueous solution having 1 wt % of iron(II) chloride dissolved therein and then the plate was washed to prepare a gate electrode.

A fluorinated polyimide having the following structure was dissolved in cyclohexanone at 10 wt % concentration to prepare a solution. Then, filtration under pressure was carried out with a 0.2 μm PTFE filter. This solution was spin coated on the ITO glass substrate at a rotational speed of 1,600 rpm and dried at 180° C. to form a gate insulating layer comprising the polyimide. The film thickness was 3,100 Å as measured by a film thickness meter ("Alpha-Step 500" manufactured by KLA-Tencor):

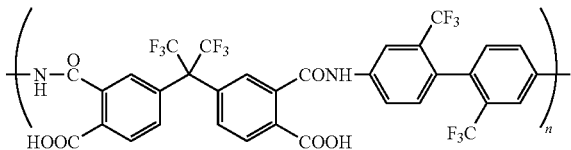

Then, to form a source electrode and a drain electrode, the gate insulating layer was covered with a shadow mask of a channel (L: 1,000 μm. W: 40 μm), and chromium was deposited in a thickness of 50 Å and gold was deposited in a thickness of 1,000 Å to prepare a bottom contact structure device as shown in FIG. 1. Then, on the bottom contact structure device, a 0.7 wt % chloroform solution prepared by dissolving copper tetrabicycloporphyrin having the following molecular structure obtained in Preparation Example 1 dissolved in chloroform in nitrogen atmosphere at room temperature, was spin coated at 1,000 rpm and dried to form a layers followed by heat treatment at 180° C. for 10 minutes to convert the layer into a semiconductor layer thereby to form an organic semiconductor layer:

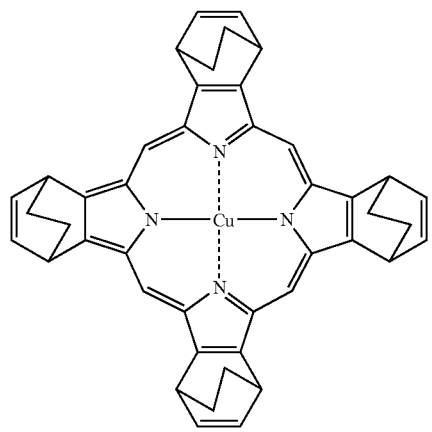

On the semiconductor layer, a 10 wt % toluene solution having polystyrene (purchased from Aldrich) dissolved in toluene at room temperature, was spin coated at 2,000 rpm, followed by heat treatment at 100° C. for 10 minutes to form an overcoat layer, thereby to prepare a field effect transistor (FET-F). To the field effect transistor device thus obtained, a stress of a gate voltage was applied at 70° C. at a gate voltage $V_g=-30V$ and at a source voltage $V_s$ and a drain voltage $V_d$ of 0 V. During this application the field strength in the gate insulation portion was calculated from $V_g$/(the film thickness of the gate portion) and was 97 MV/m. A drain voltage $V_d=-60$ V was applied for only one second per 60 seconds to measure the drain current $I_d$, and the threshold voltage $V_t$ was obtained from the $I_d$ value. This measurement was repeated for 5 hours, and the change in $V_t$ was measured from the change in $I_d$ during this measurement. As a result, the change In $V_t$ during this measurement was 2.8 V, and it was found that the field effect transistor device has very excellent driving stability.

Further, where the current which flows relative to the voltage $V_d$ applied between the source electrode and the drain electrode of the obtained field effect transistor device is represented by $I_d$, the voltage applied to the source electrode and the gate electrode $V_g$, the threshold voltage $V_t$, the capacitance per unit area of the gate insulating layer $C_i$, the channel length L, the channel width W and the mobility of the organic semiconductor layer μ, they can be represented by the relation of the following formula (1) as described hereinafter. The change in $I_d$ relative to different $V_g$ was measured, and in a graph obtained by plotting $I_d^{1/2}$ and $V_g$, the mobility μ was determined as a slope in the graph, and the threshold voltage $V_t$ was obtained from the $I_d$ intercept in the graph:

$$I_d = [WC_i/(2L)]\mu(V_g-V_t)^2 \qquad (1)$$

Further, the currents $I_d$ (−50 V) and $I_d$ (+30 V) which flow between the source electrode and the drain electrode when the voltage $V_d$ applied between the source electrode and the drain electrode was fixed at −30 V and the voltage $V_g$ applied to the source electrode and the drain electrode was −50 V and +30 V, respectively, were measured, and the on/off ratio was calculated from their ratio $I_d$(−50 V)/$I_d$(+30 V).

As a result, the mobility μ of the field effect transistor was 1.19 cm² (V·s). The threshold voltage $V_t$ was 17.8 V, and the on/off ratio was $1.45 \times 10^2$.

Example 2

On the entire surface of an oxide coating film of a N type silicon support substrate (doped with Sb, resistivity: at most 0.02 Ωcm, manufactured by Sumitomo Metal Industries, Ltd.) having an oxide coating film with a thickness of 300 nm formed on its surface as a gate insulation portion, a film of chromium with a thickness of 10 nm and a film of gold with a thickness of 100 nm were formed in this order by vacuum deposition and a source electrode and a drain electrode were formed with a channel having a length (L) of 10 μm and a width (W) of 500 μm by removing the gold film at a portion other than the source electrode and the drain electrode by etching. Further, part of the oxide coating film at a position not corresponding to these electrodes, was etched by a hydrofluoric acid/ammonium fluoride liquid, and gold was deposited with a thickness of 100 nm on the exposed portion of the silicon support substrate so as to form the contact point with the gate electrode.

Then, the following film preparation and evaluation of electric characteristics were carried out in a nitrogen atmosphere so as to avoid influence of oxygen and moisture Namely, a solution having 0.8 mg of the bicycloporphyrin copper complex obtained in the above Preparation Example dissolved in 1.25 g of chloroform was spin coated on the above support substrate having the electrodes formed thereon at 1,000 rpm, and the substrate was placed on a hot plate heated at 120° C., and heated by stepwise increasing the temperature by 10° C. every 15 minutes to 200° C. to form an organic semiconductor layer comprising a benzoporphyrin copper complex with a thickness of 100 nm. On the semiconductor layer, a 10 wt % toluene solution having polystyrene (manufactured by Aldrich) dissolved in toluene at room temperature was spin coated at 2,000 rpm and subjected to heat treatment at 100° C. for 10 minutes to form an overcoat layer with a thickness of 1 μm thereby to prepare a field effect transistor.

Then, an aging treatment was carried out under conditions as shown in the following Table.

TABLE 2

| Vd (V) | Vg (V) | Time (h) | Temperature (° C.) |
|---|---|---|---|
| −60 | −60 | 79 | Room temperature |
| −60 | −30 | 131 | Room temperature |
| −60 | −30 | 162 | 50 |
| −60 | −30 | 111 | 70 |
| −60 | −30 | 118 | Room temperature |
| −60 | −30 | 208 | 70 |
| 0 | −30 | 5 | Room temperature |
| 0 | 30 | 5 | Room temperature |
| 0 | −30 | 5 | 70 |
| 0 | 30 | 5 | 70 |
| 0 | −30 | 2.5 | 70 |
| 0 | 30 | 2.5 | 70 |
| 0 | −30 | 2.5 | 70 |
| 0 | 30 | 2.5 | 70 |
| 0 | −30 | 2.5 | Room temperature |
| 0 | −30 | 2.5 | Room temperature |
| 0 | 30 | 2.5 | Room temperature |
| 0 | 30 | 2.5 | Room temperature |
| 0 | −30 | 5 | Room temperature |
| 0 | 30 | 5 | Room temperature |

Then, the transistor was left to stand for one day/and with respect to the sample thus obtained, the $V_t$ shift at 70° C. was measured in the same manner as in Example 1. As a result, the shift in the threshold voltage was 3.7 V, and it is found that the transistor has a very excellent driving stability.

Example 3

In Example 2' the mobility μ of the field effect transistor FETE-B before the aging treatment for a long term was 1.29 cm$^2$ (V·s). The threshold voltage $V_t$ was 15 V, and the on/off ratio was 1.4×10$^6$. Further, the shift in the threshold voltage was measured and as a results it was 5.9 V, and the transistor was poor in driving stability.

Example 4

On the entire surface of an oxide coating film of a N type silicon support substrate (doped with Sb, resistivity: at most 0.02 Ωcm, manufactured by Sumitomo Metal Industries, Ltd.) having an oxide coating film with a thickness of 300 nm formed on its surface as a gate insulation portion, a film of chromium with a thickness of 10 nm and a film of gold with a thickness of 100 nm were formed in this order by vacuum deposition, and a source electrode and a drain electrode were formed with a channel having a length (L) of 10 μm and a width (W) of 500 μm by removing the gold film at a portion other than a source electrode and a drain electrode by etching. Further, the oxide coating film at a position not corresponding to these electrodes was etched by a hydrofluoric acid/ammonium fluoride solution, and gold was deposited with a thickness of 100 nm on the exposed portion of the silicon support substrate, and a voltage was applied to the gate electrode through the deposited portiron.

Then, the following film formation and evaluation of electric characteristics were carried out in a nitrogen atmosphere so as to avoid Influence of oxygen and moisture. Namely, a solution having 0.8 mg of the bicycloporphyrin copper complex obtained in the above Preparation Example 1 dissolved in 1.25 g of chloroform was spin coated on the above support substrate having the electrodes formed thereon at 1,000 rpm, and the substrate was placed on a hot plate heated at 170° C., and heated by stepwise increasing the temperature by 10° C. every 15 minutes to 200° C. to form an organic semiconductor layer comprising a benzoporphyrin copper complex with a thickness of 100 nm thereby to prepare a field effect transistor FET-A.

The mobility μ of the obtained field effect transistor was 1.22 cm$^2$ (V·s), the threshold voltage $V_t$ was 34 V, and the on/off ratio was 1.8×10$^2$.

Further, the shift in the threshold voltage was measured and as a result, it was 12.6 V, an the transistor was poor in driving stability.

Example 5 on a 4 inch glass mask wafer support substrate (surface polished, manufactured by Universal), chromium was deposited with a thickness of 100 nm at a degree of vacuum of 10$^{-6}$ Torr by means of photolithography (lift-off method) employing a negative photoresist ZPN1100 (manufactured by ZEON CORPORATION) Then, an unnecessary resist pattern was removed by means of an organic solvent, and the surface was subjected to ultrasonic cleaning by means of an Extran cleaning liquid manufactured by Merck, Ltd., Japan) for patterning a gate electrode of chromium with a thickness of 100 nm.

Further, 2 mL of a polyamic acid solution obtained by dissolving the polyamic acid obtained in the above Preparation Example 4 dissolved in N-methylpyrrolidone at a concentration of 20 wt %, followed by filtration with a 0.2 μm filter, was spread and spin coated at 3,000 rpm for 120 seconds to form a film, followed by gradual heating to 300° in nitrogen for imidization to prepare a gate insulating layer comprising a polyimide. The film thickness was 900 nm as measured by a film thickness meter ("Alpha-Step500" manufactured by KLA-Tencor). The capacitance of the insulating layer was measured by means of an electrical measurement apparatus "4284A" manufactured by Agilent Technologies and as a result, it was 2.84×10$^{-9}$ F/cm$^2$.

On the gate insulating layer of the polyimide, chromium with a thickness of 10 nm and gold with a thickness of 100 nm were deposited at a degree of vacuum of 10$^{-6}$ Torr by means of photolithography employing a negative photoresist ZPN1100 manufactured by ZEON CORPORATION) again, and an unnecessary resist pattern was removed by means of an organic solvent, followed by washing for patterning a source electrode and a drain electrode.

Then, a solution obtained by dissolving the bicycloporphyrin copper complex obtained in the above Preparation Example 1 in chloroform at a concentration of 0.7 wt % in a nitrogen atmosphere at room temperature, was spin coated on the above support substrate having the electrodes formed thereon, followed by heat treatment at 210° C. for 5 minutes to convert the bicycloporphyrin copper complex into a benzoporphyrin copper complex, and a 10 wt % toluene solution of polystyrene was further overcoated and dried to form a protective layer, thereby to prepare a field effect transistor FET-C. The mobility μ of the obtained field effect transistor FET-C was 1.12 cm² (V·s) and the on/off ratio was 1.4×10².

Comparative Example 1

The same operation as in Example 4 was carried out except that the organic semiconductor layer was formed by vacuum deposition of pentacene manufactured by TOKYO KASEI KOGYO Co., Ltd.) purified by sublimation with a film thickness of 100 nm, to prepare a field effect transistor FET-D. The mobility μ of the obtained field effect transistor FET-D was 0.20 cm² (V·s).

Then, the shift in the threshold voltage was measured in the same manner as in Example 1 and as a result, it was 15.1 V, and the transistor was poor in driving stability.

Comparative Example 2

The same operation as in Example 1 was carried out except that the bicycloporphyrin having the following structure obtained in Preparation Example 2 was used in the form of a chlorobenzene solution as the material for formation of an organic semiconductor layer, and that heat treatment at 210° C. for 10 minutes was carried out to convert the bicycloporphyrin into benzoporphyrin, to prepare a field effect transistor FET-E. The mobility μ of the obtained field effect transistor FET-E was 0.01 cm² (V·s).

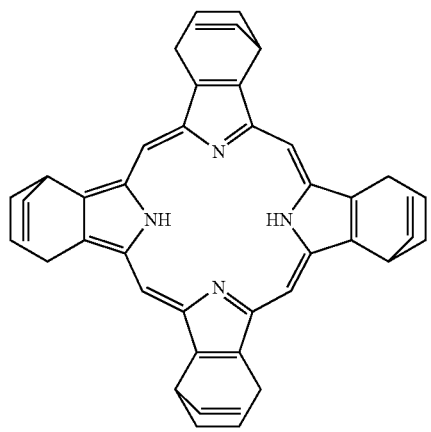

Comparative Example 3

The same operation as in Example 4 was carried out except that the method for forming the source electrode and the drain electrode was changed to photolithography (lift-off method) employing a negative photoresist ZPN1100 (manufactured by ZEON CORPORATION), and that the bicycloporphyrin copper complex obtained in Preparation Example 3 was used instead of the bicycloporphyrin copper complex obtained in Preparation Example 1, to prepare a field effect transistor. The mobility was 0.02 cm² (V·s).

The results of the above Examples and Comparative Examples are summarized in the following Table

TABLE 3

| | Semi-conductor | Semi-conductor purity | Insulating film | Overcoat | Electrode formation method | Aging | μm | $\Delta V_t$ |
|---|---|---|---|---|---|---|---|---|
| Ex. 1 | CuBP | 97.3% | Fluorinated polyimide | Polystyrene | Shadow mask | Nil | 1.2 | 2.8 |
| Ex. 2 | CuBP | 97.3% | SiO₂ | Polystyrene | Etching | Aged | 0.2 | 3.7 |
| Ex. 3 | CuBP | 97.3% | SiO₂ | Polystyrene | Etching | Nil | 1.4 | 5.9 |
| Ex. 4 | CuBP | 97.3% | SiO₂ | Nil | Etching | Nil | 1.2 | 12.6 |
| Ex. 5 | CuBP | 97.3% | Polyimide | Polystyrene | Lift-off | Nil | 1.4 | |
| Comp. Ex. 1 | Pentacene | 99.6% | SiO₂ | Polystyrene | Etching | Nil | 0.2 | 15.1 |
| Comp. Ex. 2 | BP | 97.7% | SiO₂ | Nil | Etching | Nil | 0.01 | 5.3 |
| Comp. Ex. 3 | CuBP | 92.4% | SiO₂ | Nil | Lift-off | Nil | 0.02 | |

Further, the $V-V_{on}$ value when each of the field effect transistors A to E obtained in Examples 1, 3 to 5 and Comparative Examples 1 and 2 was employed as a driving circuit of three types of display device LCD, PD and DP, was calculated employing the above formula (2), and the results are shown in Table 1. It is evident from the results that in each of the field effect transistors A to C of Examples 1 and 3 to 5 $V/V_{on} \geq 0.99$ is achieved even in LCD driving.

TABLE 4

| | Field effect transistor | Mobility μ (cm²/(V·s)) | V/V_on | | |
|---|---|---|---|---|---|
| | | | LCD | PD | DP |
| Ex. 1 | FET-F | 1.2 | 0.998 | 1.000 | 1.000 |
| Ex. 3 | FET-B | 1.29 | 0.998 | 1.000 | 1.000 |
| Ex. 4 | FET-A | 1.22 | 0.998 | 1.000 | 1.000 |
| Ex. 5 | FET-C | 1.12 | 0.996 | 1.000 | 1.000 |
| Comp. Ex. 1 | FET-D | 0.20 | 0.632 | 0.993 | 1.000 |
| Comp. Ex. 2 | FET-E | 0.01 | 0.049 | 0.221 | 1.000 |

Industrial Applicability

The field effect transistor of the present invention is useful for wide industrial fields, for example, employing electronic devices. Specifically it can be used as an active matrix of displays such as a liquid crystal display device, a polymer dispersed liquid crystal display, an electronic paper, an organic LED display device, an electrophoretic display device, an inorganic EL display device and an electrochromic device, and further, it can be used also for an IC tag, an IC chip a sensor and the like.

The entire disclosures of Japanese Patent Application No. 2004-327627 filed on Nov. 11, 2004 and Japanese Patent Application No. 2005-89935 filed on Mar. 25, 2005 including specifications, claims drawings and summaries are incorporated herein by reference in their entireties.

The invention claimed is:

1. A method for producing a field effect transistor including a gate insulation portion in contact with a gate, an organic semiconductor portion including a cyclic azaannulene compound in contact with the gate insulation portion, a source electrode and a drain electrode in contact with the organic semiconductor portion, the method comprising:

applying an electrical field to a gate electrode by applying a voltage to the gate at 70° C. for 5.0±0.1 hours so that the field strength in the gate insulation portion is 100±5 MV/m resulting in the field effect transistor having a change in a threshold voltage that is within 5 V.

2. The method according to claim 1, wherein the organic semiconductor portion contains a porphyrin or phthalocyanine type compound.

3. The method according to claim 1, wherein the organic semiconductor portion contains an organic semiconductor converted from an organic semiconductor precursor.

4. The method according to claim 1, wherein the field effect transistor has an overcoat layer in contact with the organic semiconductor portion.

5. The method according to claim 1, wherein the gate insulation portion of the field effect transistor contains a polymer material.

* * * * *